(12) United States Patent
Deng et al.

(10) Patent No.: US 9,608,435 B2
(45) Date of Patent: Mar. 28, 2017

(54) ELECTRONIC DEVICE AND MOTHERBOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Jun-Yi Deng, Wuhan (CN); Chun-Sheng Chen, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 77 days.

(21) Appl. No.: 14/755,488

(22) Filed: Jun. 30, 2015

(65) Prior Publication Data

US 2016/0352095 A1    Dec. 1, 2016

(30) Foreign Application Priority Data

May 28, 2015    (CN) .......................... 2015 1 0279124

(51) Int. Cl.
 *H03K 17/687*    (2006.01)
 *H02H 7/20*    (2006.01)

(52) U.S. Cl.
 CPC ........... *H02H 7/20* (2013.01); *H03K 17/6871* (2013.01)

(58) Field of Classification Search
 CPC ........ G06F 1/3287; G06F 1/3253; G06F 1/32; G06F 11/3051; G05F 3/02; H02H 7/20; H02M 3/04
 USPC ....... 327/434, 427, 437, 142, 143, 403, 404, 327/405, 407, 408; 323/304; 710/313
 See application file for complete search history.

(56) References Cited

U.S. PATENT DOCUMENTS

| | | | |
|---|---|---|---|
| 9,448,578 B1* | 9/2016 | Deng | G05F 3/02 |
| 2016/0197548 A1* | 7/2016 | Chang | G06F 1/3203 323/304 |
| 2016/0274612 A1* | 9/2016 | Deng | G05F 3/02 |
| 2016/0274650 A1* | 9/2016 | Deng | G06F 1/26 |
| 2016/0285253 A1* | 9/2016 | Chang | H02H 7/20 |

* cited by examiner

*Primary Examiner* — Lincoln Donovan
*Assistant Examiner* — Thomas Skibinski
(74) *Attorney, Agent, or Firm* — Zhigang Ma

(57) ABSTRACT

An electronic device includes a motherboard and a display. The motherboard includes a south bridge chip, a leak-proof circuit, and a connector. The leak-proof circuit includes a control unit and a first signal transmission unit. The control unit is electrically coupled to a power supply. The first signal transmission unit includes a first electronic switch, a second electronic switch and a first resistor. The second electronic switch is electrically coupled to ground through the first resistor. When the motherboard is turned off and the display is turned on, the power supply does not provide power to the control unit, and the control unit outputs a first control signal to the first and the second electronic switches. The first and the second electronic switches are in pinch-off mode. Signals from the display flow into ground through the second electronic switch and the first resistor.

10 Claims, 2 Drawing Sheets

ELECTRONIC DEVICE AND MOTHERBOARD

FIELD

The subject matter herein generally relates to electronic devices and particularly to an electronic device with a motherboard.

BACKGROUND

When an electronic device (such as a computer) is powered off, a motherboard of the electronic device is electrically coupled to a display, and current of the display will flow to the motherboard. The current flowing to the motherboard may damage electronic components on the motherboard.

BRIEF DESCRIPTION OF THE DRAWING

Implementations of the present technology will now be described, by way of example only, with reference to the attached figures.

DETAILED DESCRIPTION

Figure 1:
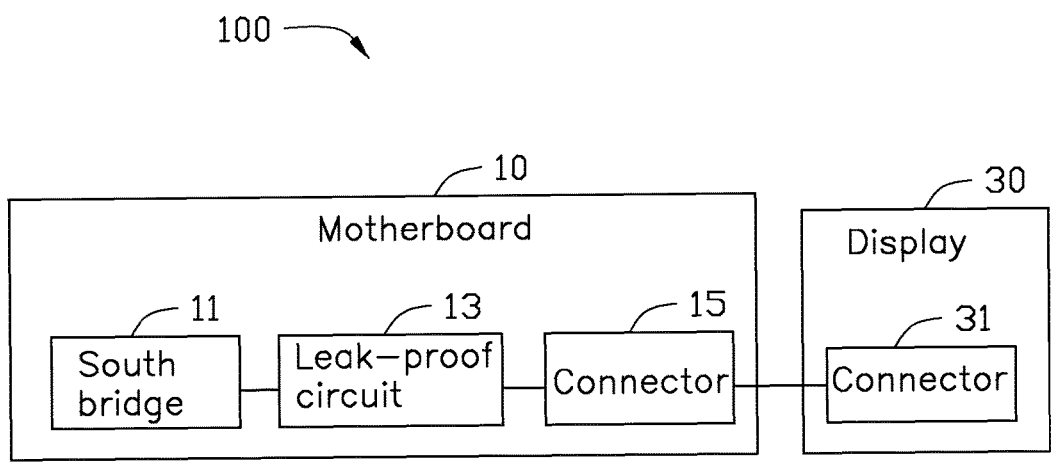
FIG. 1 is a block diagram of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawing is not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections.

The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure relates to an electronic device with a motherboard.

FIG. 1 illustrates an embodiment of an electronic device 100. The electronic device 100 can comprise a motherboard 10 and a display 30. The motherboard 10 can comprise a south bridge 11, a leak-proof circuit 13 and a connector 15. The leak-proof circuit 13 is electrically coupled to the south bridge 11 and the connector 15. The display 30 can comprise a connector 31, and the connector 15 of the motherboard 10 is electrically coupled to the connector 31 of the display 30.

In at least one embodiment, the connector 15 of the motherboard 10 can be a Display Port, and the connector 31 of the display 30 can be a Display Port or a High Definition Multimedia Interface (HDMI). The south bridge 11 can be a Platform Controller Hub (PCH).

Figure 2:
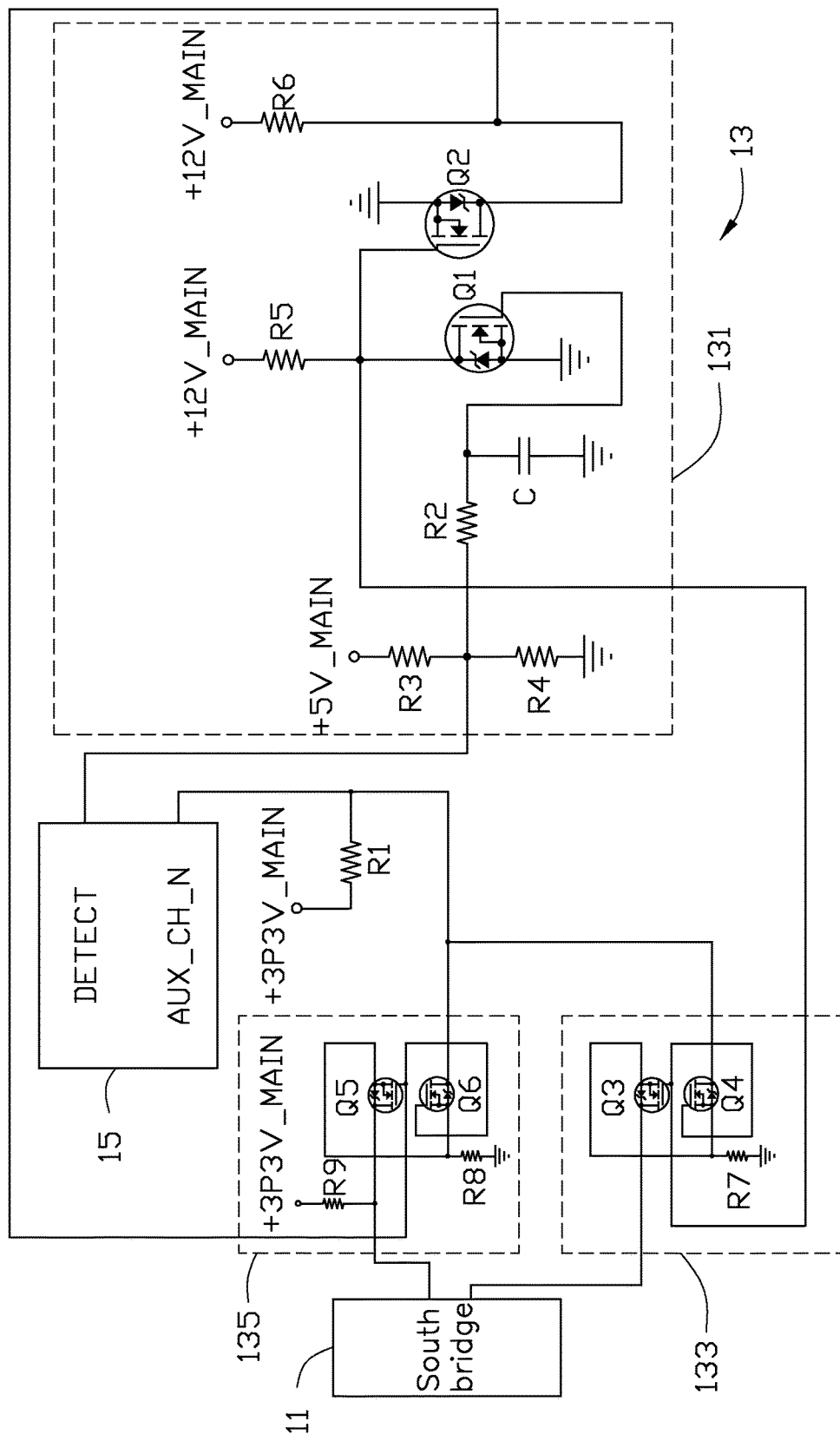
FIG. 2 is a circuit diagram of the embodiment of the electronic device.

FIG. 2 illustrates a circuit diagram of the electronic device 100. The connector 15 of the motherboard 10 can comprise an output pin AUX_CH_N and a detection pin DETECT. The output pin AUX_CH_N is electrically coupled to a power supply +3P3V_MAIN through a resistor R1. The leak-proof circuit 13 can comprise a control unit 131, a first signal transmission unit 133 and a second signal transmission unit 135.

The control unit 131 can comprise two electronic switches Q1 and Q2. The electronic switch Q1 can comprise a first terminal, a second terminal and a third terminal. The electronic switch Q2 can comprise a first terminal, a second terminal and a third terminal. The first terminal of the electronic switch Q1 is electrically coupled to the detection pin DETECT of the connector 15 through a resistor R2, and electrically coupled to ground through a capacitor C. The first terminal of the electronic switch Q1 is electrically coupled to a power supply +5V_MAIN successively through the resistor R2 and a resistor R3, and electrically coupled to ground successively through the resistor R2 and a resistor R4. The second terminal of the electronic switch Q1 is electrically coupled to the first terminal of the electronic switch Q2, and electrically coupled to a power supply +12V_MAIN through a resistor R5. The second terminal of the electronic switch Q1 is further electrically coupled to the first signal transmission unit 133. The third terminal of the electronic switch Q1 is electrically coupled to ground. The second terminal of the electronic switch Q2 is electrically coupled to the power supply +12V_MAIN through a resistor R6, and electrically coupled to the second signal transmission unit 135. The third terminal of the electronic switch Q2 is electrically coupled to ground. In at least one embodiment, the power supply +5V_MAIN and +12V_MAIN are provided by the motherboard 10. When the motherboard 10 is powered off, the power supply +5V_MAIN and +12V_MAIN do not provide power.

The first signal transmission unit 133 can comprise two electronic switches Q3 and Q4. The electronic switch Q3 can comprise a first terminal, a second terminal and a third terminal. The electronic switch Q4 can comprise a first terminal, a second terminal and a third terminal. The first terminal of the electronic switch Q3 is electrically coupled to the first terminal of the electronic switch Q4, and electrically coupled to the second terminal of the electronic switch Q1. The second terminal of the electronic switch Q3 is electrically coupled to the south bridge 11. The third terminal of the electronic switch Q3 is electrically coupled to the third terminal of the electronic switch Q4, and electrically coupled to ground through a resistor R7. The second terminal of the electronic switch Q4 is electrically coupled to the output pin AUX_CH_N.

The second signal transmission unit 135 can comprise two electronic switches Q5 and Q6. The electronic switch Q5 can comprise a first terminal, a second terminal and a third terminal. The electronic switch Q6 can comprise a first terminal, a second terminal and a third terminal. The first terminal of the electronic switch Q5 is electrically coupled to the first terminal of the electronic switch Q6, and electrically coupled to the second terminal of the electronic switch Q2. The second terminal of the electronic switch Q5 is electrically coupled to the south bridge 11, and electrically coupled to the power supply +3P3V_MAIN through a resistor R9. The third terminal of the electronic switch Q5 is electrically coupled to the third terminal of the electronic switch Q6, and electrically coupled to ground through a resistor R8. The second terminal of the electronic switch Q6 is electrically coupled to the output pin AUX_CH_N.

In at least one embodiment, each of the electronic switches Q1-Q6 can be n-channel metal-oxide semiconductor field-effect transistors (NMOSFET), and the first terminal, the second terminal, and the third terminal of each of the electronic switches Q1-Q6 correspond to a gate, a drain, and a source of the NMOSFET.

When the electronic device 100 works normally, the motherboard 10 and the display 30 work normally, and the motherboard 10 is communicating with the display 30 through the connectors 15 and 31. When the connector 31 is a Display Port, the detection pin DETECT of the connector 15 outputs a low level signal to the first terminal of the electronic switch Q1, and the electronic switch Q1 is turned off. The second terminal of the electronic switch Q1 outputs a high level signal to the first terminals of the electronic switches Q2, Q3 and Q4, the electronic switches Q2, Q3 and Q4 are turned on. The second terminal of the electronic switch Q2 outputs a low level signal to the first terminals of the electronic switches Q5 and Q6, and the electronic switches Q5 and Q6 are turned off. The south bridge 11 is communicating with the display 30 through the electronic switches Q3 and Q4 and the connectors 15 and 31. When the connector 31 is a HDMI, the detection pin DETECT of the connector 15 outputs a high level signal to the first terminal of the electronic switch Q1, and the electronic switch Q1 is turned on. The second terminal of the electronic switch Q1 outputs a low level signal to the first terminals of the electronic switches Q2, Q3 and Q4, the electronic switches Q2, Q3 and Q4 are turned off. The second terminal of the electronic switch Q2 outputs a high level signal to the first terminals of the electronic switches Q5 and Q6, and the electronic switches Q5 and Q6 are turned on. The south bridge 11 is communicating with the display 30 through the electronic switches Q5 and Q6 and the connectors 15 and 31.

When the motherboard 10 is powered off and the display 30 is powered on, and the motherboard 10 is electrically coupled to the display 30, the power supply +5V_MAIN and +12V_MAIN does not provide power. The second terminal of the electronic switch Q1 outputs the low level signal to the first terminals of the electronic switches Q2, Q3 and Q4. The electronic switch Q2 is turned off, and the electronic switches Q3 and Q4 are in pinch-off mode. The second terminal of the electronic switch Q2 outputs the low level signal to the first terminal of the electronic switches Q5 and Q6, and the electronic switches Q5 and Q6 are in pinch-off mode. Signals from the display 30 are input to the second terminals of the electronic switches Q4 and Q6 through the connector 31 and the output pin AUX_CH_N of the connector 15, and flow into ground through the second terminal and the third terminal of the electronic switch Q4 and the resistor R7, and flow into ground through the second terminal and the third terminal of the electronic switch Q6 and the resistor R8. Therefore, the signals from the display 30 cannot flow to the south bridge 11 of the motherboard 10.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. An electronic device comprising:
   a motherboard comprising:
      a south bridge;
      a leak-proof circuit comprising a control unit and a first signal transmission unit; and
      a connector;
   a display configured to be electrically coupled to the connector;
   wherein the control unit is electrically coupled to a power supply, the first signal transmission unit comprises a first electronic switch, a second electronic switch and a first resistor, the first electronic switch comprises a first terminal, a second terminal and a third terminal, the second electronic switch comprises a first terminal, a second terminal and a third terminal, the first terminal of the first electronic switch is electrically coupled to the first terminal of the second electronic switch, and electrically coupled to the control unit, the second terminal of the first electronic switch is electrically coupled to the south bridge, the third terminal of the first electronic switch is electrically coupled to the third terminal of the second electronic switch, and electrically coupled to ground through the first resistor, and the second terminal of the second electronic switch is electrically coupled to the connector;
   wherein in event that the motherboard is powered off and the display is powered on, the power supply does not provide power to the control unit, the control unit outputs a first control signal to the first terminals of the first electronic switch and the second electronic switch, the first electronic switch and the second electronic switch are in pinch-off mode, and signals from the display are flowed into ground through the connector, the second terminal and the third terminal of the second electronic switch and the first resistor.

2. The electronic device of claim 1, wherein the leak-proof circuit further comprises a second signal transmission unit, the second transmission unit comprises a third electronic switch, a fourth electronic switch and a second resistor, the third electronic switch comprises a first terminal, a second terminal and a third terminal, the fourth electronic switch comprises a first terminal, a second terminal and a third terminal, the first terminal of the third electronic switch is electrically coupled to the first terminal of the fourth electronic switch, and electrically coupled to the control unit, the second terminal of the third electronic switch is electrically coupled to the south bridge, the third terminal of the third electronic switch is electrically coupled to the third terminal of the fourth electronic switch, and electrically coupled to ground through the second resistor, and the second terminal of the fourth electronic switch is electrically coupled to the connector; in event that the motherboard is powered off and the display is powered on, the power supply does not provide power to the control unit, the control unit outputs a second control signal to the first terminals of the third electronic switch and the fourth electronic switch, the third electronic switch and the fourth electronic switch are in pinch-off mode, and signals from the display are flowed into ground through the connector, the second terminal and the third terminal of the fourth electronic switch and the second resistor.

3. The electronic device of claim 2, wherein the control unit comprises a fifth electronic switch and a sixth electronic switch, the fifth electronic switch comprises a first terminal, a second terminal and a third terminal, the sixth electronic switch comprises a first terminal, a second terminal and a third terminal, the first terminal of the fifth electronic switch is electrically coupled to the connector and electrically coupled to ground through a capacitor, the second terminal of the fifth electronic switch is electrically coupled to the first terminal of the sixth electronic switch and electrically coupled to the power supply through a third resistor, the second terminal of the fifth electronic switch is electrically coupled to the first terminals of the first electronic switch and the second electronic switch, the third terminal of the fifth electronic switch is electrically coupled to ground, the second terminal of the sixth electronic switch is electrically coupled to the power supply through a fourth resistor and electrically coupled to the first terminals of the third electronic switch and the fourth electronic switch, and the third terminal of the sixth electronic switch is electrically coupled to ground; in event that the motherboard is powered off and the display is powered on, the power supply does not provide power to the control unit, the second terminal of the fifth electronic switch outputs the first control signal to the first terminals of the first electronic switch and the second electronic switch, the sixth electronic switch is turned off, and the second terminal of the sixth electronic switch outputs the second control signal to the first terminals of the third electronic switch and the fourth electronic switch.

4. The electronic device of claim 3, wherein the connector comprises a detection pin and an output pin, the detection pin is electrically coupled to the first terminal of the fifth electronic switch to control the fifth electronic switch to be turned on or turned off, and the output pin is electrically coupled to the second terminals of the second electronic switch and the fourth electronic switch to transport the signals from the display to the second electronic switch and the fourth electronic switch.

5. The electronic device of claim 3, wherein the first to the sixth electronic switches are all n-channel metal-oxide semiconductor field-effect transistors (NMOSFET), the first terminal, the second terminal and the third terminal of the first to the sixth electronic switches correspond to a gate, a drain, and a source of the n-channel metal-oxide semiconductor field-effect transistors.

6. A motherboard comprising:
a south bridge;
a leak-proof circuit comprising a control unit and a first signal transmission unit; and
a connector configured to be electrically coupled to a display;
wherein the control unit is electrically coupled to a power supply, the first signal transmission unit comprises a first electronic switch, a second electronic switch and a first resistor, the first electronic switch comprises a first terminal, a second terminal and a third terminal, the second electronic switch comprises a first terminal, a second terminal and a third terminal, the first terminal of the first electronic switch is electrically coupled to the first terminal of the second electronic switch, and electrically coupled to the control unit, the second terminal of the first electronic switch is electrically coupled to the south bridge, the third terminal of the first electronic switch is electrically coupled to the third terminal of the second electronic switch, and electrically coupled to ground through the first resistor, and the second terminal of the second electronic switch is electrically coupled to the connector;
wherein in event that the motherboard is powered off and the display is powered on, the power supply does not provide power to the control unit, the control unit outputs a first control signal to the first terminals of the first electronic switch and the second electronic switch, the first electronic switch and the second electronic switch are in pinch-off mode, and signals from the display are flowed into ground through the connector, the second terminal and the third terminal of the second electronic switch and the first resistor.

7. The motherboard of claim 6, wherein the leak-proof circuit further comprises a second signal transmission unit, the second transmission unit comprises a third electronic switch, a fourth electronic switch and a second resistor, the third electronic switch comprises a first terminal, a second terminal and a third terminal, the fourth electronic switch comprises a first terminal, a second terminal and a third terminal, the first terminal of the third electronic switch is electrically coupled to the first terminal of the fourth electronic switch, and electrically coupled to the control unit, the second terminal of the third electronic switch is electrically coupled to the south bridge, the third terminal of the third electronic switch is electrically coupled to the third terminal of the fourth electronic switch, and electrically coupled to ground through the second resistor, and the second terminal of the fourth electronic switch is electrically coupled to the connector; in event that the motherboard is powered off and the display is powered on, the power supply does not provide power to the control unit, the control unit outputs a second control signal to the first terminals of the third electronic switch and the fourth electronic switch, the third electronic switch and the fourth electronic switch are in pinch-off mode, and signals from the display are flowed into ground through the connector, the second terminal and the third terminal of the fourth electronic switch and the second resistor.

8. The motherboard of claim 7, wherein the control unit comprises a fifth electronic switch and a sixth electronic switch, the fifth electronic switch comprises a first terminal, a second terminal and a third terminal, the sixth electronic switch comprises a first terminal, a second terminal and a third terminal, the first terminal of the fifth electronic switch is electrically coupled to the connector and electrically coupled to ground through a capacitor, the second terminal of the fifth electronic switch is electrically coupled to the first terminal of the sixth electronic switch and electrically coupled to the power supply through a third resistor, the second terminal of the fifth electronic switch is electrically coupled to the first terminals of the first electronic switch and the second electronic switch, the third terminal of the fifth electronic switch is electrically coupled to ground, the second terminal of the sixth electronic switch is electrically coupled to the power supply through a fourth resistor and electrically coupled to the first terminals of the third electronic switch and the fourth electronic switch, and the third terminal of the sixth electronic switch is electrically coupled to ground; in event that the motherboard is powered off and the display is powered on, the power supply does not provide power to the control unit, the second terminal of the fifth electronic switch outputs the first control signal to the first terminals of the first electronic switch and the second electronic switch, the sixth electronic switch is turned off, and the second terminal of the sixth electronic switch outputs the second control signal to the first terminals of the third electronic switch and the fourth electronic switch.

9. The motherboard of claim 8, wherein the connector comprises a detection pin and an output pin, the detection pin is electrically coupled to the first terminal of the fifth electronic switch to control the fifth electronic switch to be turned on or turned off, and the output pin is electrically coupled to the second terminals of the second electronic switch and the fourth electronic switch to transport the signals from the display to the second electronic switch and the fourth electronic switch.

10. The motherboard of claim 8, wherein the first to the sixth electronic switches are all n-channel metal-oxide semiconductor field-effect transistors (NMOSFET), the first terminal, the second terminal and the third terminal of the first to the sixth electronic switches correspond to a gate, a drain, and a source of the n-channel metal-oxide semiconductor field-effect transistors.

* * * * *